United States Patent
Zeng et al.

(10) Patent No.: US 10,340,967 B2
(45) Date of Patent: Jul. 2, 2019

(54) DYNAMIC HIGH-PASS FILTER CUT-OFF FREQUENCY ADJUSTMENT

(71) Applicant: Apple Inc., Cupertino, CA (US)

(72) Inventors: Xinping Zeng, San Jose, CA (US); Mohit Narang, Cupertino, CA (US); Peter M. Agboh, Burlingame, CA (US); Vusthla Sunil Reddy, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/716,430

(22) Filed: Sep. 26, 2017

(65) Prior Publication Data

US 2019/0097664 A1    Mar. 28, 2019

(51) Int. Cl.
| | |
|---|---|
| *H03D 1/22* | (2006.01) |
| *H03D 3/00* | (2006.01) |
| *H03H 7/06* | (2006.01) |
| *H04B 1/30* | (2006.01) |
| *H04B 5/00* | (2006.01) |

(52) U.S. Cl.
CPC .............. *H04B 1/30* (2013.01); *H03D 1/22* (2013.01); *H03D 3/005* (2013.01); *H03D 3/008* (2013.01); *H03H 7/06* (2013.01); *H04B 5/0081* (2013.01); *H04B 2001/305* (2013.01)

(58) Field of Classification Search
CPC . H04B 1/16; H04B 1/30; H04B 1/302; H04B 1/38; H04B 1/40; H04B 5/008; H04B 5/02; H04B 2001/305; H03H 7/06; H03D 1/22; H03D 1/2245; H03D 3/004; H03D 3/005; H03D 3/008

USPC ....... 375/219, 220, 222, 279–281, 316, 324, 375/326, 329, 331, 332, 340, 344, 345, 375/350; 329/304, 306, 345, 346; 455/39, 41.1, 43, 45, 500, 73, 75, 76, 86, 455/88, 136, 141, 209, 213, 236.1, 334, 455/337, 339, 340

See application file for complete search history.

(56) References Cited

U.S. PATENT DOCUMENTS

| | | | | |
|---|---|---|---|---|
| 2009/0088106 A1* | 4/2009 | Hwang | ..................... | H04B 1/30 455/150.1 |
| 2009/0212839 A1* | 8/2009 | Chung | ..................... | H04B 1/30 327/307 |
| 2011/0026507 A1* | 2/2011 | Katsube | ............... | H03H 7/0153 370/338 |
| 2013/0237190 A1* | 9/2013 | Smith | ................. | H04L 63/0492 455/411 |
| 2014/0018011 A1* | 1/2014 | Chen | ....................... | H04B 1/30 455/73 |

(Continued)

*Primary Examiner* — Young T Tse
(74) *Attorney, Agent, or Firm* — Morgan, Lewis & Bockius LLP

(57) ABSTRACT

A transceiver that allows dynamic high-pass filter (HPF) cut-off frequency adjustment may include a mixer circuit to mix a local oscillator (LO) signal with a receive (RX) signal received from a transmitter to generate a baseband signal. The transceiver may further include a high-pass filter (HPF) having an adjustable cut-off frequency that is used to reduce a DC offset of the baseband signal. A control circuit can dynamically control components of the HPF to set the adjustable cut-off frequency at a first frequency during a first time period and at a second frequency during a second time period.

21 Claims, 4 Drawing Sheets

(56) References Cited

U.S. PATENT DOCUMENTS

| | | | |
|---|---|---|---|
| 2014/0125450 A1* | 5/2014 | Brandolese | B60R 21/0132 340/3.1 |
| 2014/0146926 A1* | 5/2014 | Kitamura | H04L 1/0036 375/345 |
| 2017/0019068 A1* | 1/2017 | Chu | H03D 7/16 |
| 2018/0067196 A1* | 3/2018 | Irish | G01S 7/4865 |

* cited by examiner

DYNAMIC HIGH-PASS FILTER CUT-OFF FREQUENCY ADJUSTMENT

TECHNICAL FIELD

The present description relates generally to wireless communications, including to a dynamic high-pass filter (HPF) cut-off frequency adjustment.

BACKGROUND

Near field communication (NFC) enabled communication devices, such as mobile phones, can establish communication with another device by touching or bringing the NFC enabled communication device into close proximity with the other device. The other device can be, e.g., another mobile device, an NFC reader, such as a payment kiosk, an NFC tag, or an NFC card such as a proximity integrated circuit card (PICC). NFC enabled devices have to be located within a relatively small distance from one another to allow information exchange through electromagnetic induction between their corresponding loop antennas. Ranges of the order of several centimeters (e.g., up to about 10 centimeters) are common for many NFC devices. A first NFC device may transmit a magnetic field modulated with the information to be exchanged, such as credit card information for payment in a contactless financial transaction, or ticket fare information in an electronic ticketing transaction. A second NFC device nearby may receive the information via inductive coupling, and may respond to the first NFC device by transmitting or generating its own modulated magnetic field and inductively coupling this magnetic field to the first NFC device.

In another mode of operation, an NFC-enabled device may operate as an NFC reader and/or writer and communicate with an NFC tag or a PICC, which is a passive data store that can be read, and under certain conditions written to, by an NFC device. NFC tags and PICCs have no power source (e.g., battery) and can be custom-encoded by the manufactures or be encoded using industry specifications. An NFC reader can transmit a carrier signal (e.g., at 13.56 MHz) during reception. The carrier signal can provide energy to power the NFC tag (or the PICC). The NFC tag or the PICC transmits data to the NFC reader by modulating the carrier signal with the data.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects, the subject technology is directed to dynamic high-pass filter cut-off-frequency adjustment for a zero intermediate frequency (ZIF) receiver. In one or more implementations, the ZIF receiver is part of a near-field communication (NFC) transceiver, for example, an NFC passive device such as a smart card, also referred to as a proximity integrated circuit card (PICC), a proximity card, an NFC card, and the like. In one or more implementations, the NFC transceiver includes a homodyne mixer circuit that can mix a local oscillator (LO) signal with a signal received from another transceiver to generate a baseband signal. The other transceiver can be a smart card reader (hereinafter "card reader"), which may be integrated with a portable communication device (e.g., a smart phone). The card reader may also be referred to as a transmitter, as it transmits the signal received by the homodyne mixer circuit.

A high-pass filter (HPF) of the ZIF receiver can have an adjustable cut-off frequency. The HPF can be used in ZIF receivers to remove DC-offset. Normally, the cut-off frequency of the HPF is set low to avoid excessive filtering of the signal-of-interest. The low cut-off frequency of the HPF can, however, lead to a long receiver settling time (e.g., approximately a few milliseconds), which may result in missing a portion of a signal transmitted by a card reader. The subject technology allows controlling components of the HPF to change the cut-off frequency of the HPF in order to address the long settling time. In one or more implementations, the cut-off frequency of the HPF may be increased to decrease the receiver settling time, for example, to achieve a settling time (e.g., approximately 10-15 microseconds) that is compliant with a corresponding standard specification (e.g., 132 microseconds) or other application.

Figure 1:
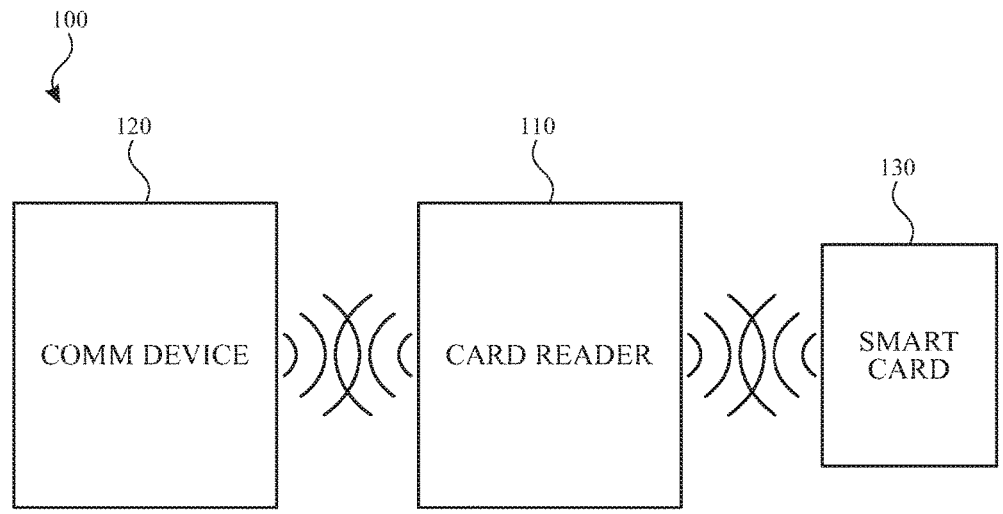
FIG. 1 is a high-level diagram illustrating an example environment within which the subject technology may be implemented.

FIG. 1 is a high-level diagram illustrating an environment 100 within which the subject technology may be implemented. Not all of the depicted components may be used in all implementations, however, and one or more implementations may include additional or different components than those shown in the FIG. 1. Variations in the arrangement and type of the components may be made without departing from the spirit or scope of the claims as set forth herein.

Additional components, different components, or fewer components may be provided.

The environment 100 includes a card reader 110, a communication device 120 and a smart card 130. Examples of the communication device 120 include portable communication devices (e.g., a cell phone, a smart phone, a smart watch, a tablet and a phablet) and personal computing systems. In some embodiments, the card reader 110 may be a portable communication device or may be integrated with a portable communication device. In some aspects, the smart card 130 can be any other passive communication device such as a NFC tag. The card reader 110 and the communication device 120 are NFC enabled and can communicate in NFC mode enabled, for example, by electromagnetic induction between two loop antennas of the two communication devices. The NFC connection between the card reader 110 and the communication device 120 can be an NFC peer-to-peer communication that enables two devices to connect with each other and exchange information in an ad hoc fashion. The communication device 120 or the portable communication device including the card reader 110 may also include application software and/or firmware to operate in an NFC card emulation mode, for example, to operate as a smart card, allowing a user to perform transactions, such as payment or ticketing, when connected to an NFC-compliant apparatus.

The card reader 110 can operate in an NFC read and/or write mode when in communication with the smart card 130 (or an NFC tag). In the NFC read and/or write mode, the card reader 110 can read information stored in the smart card 130 or the NFC tag that can be embedded, for example, in a label or a smart poster. The subject technology pertains to the NFC read and/or write mode of operation of the card reader 110. As an NFC reader, card reader 110 transmits a carrier signal (e.g., at about 13.56 MHz) during reception. The carrier signal provides energy to power the smart card 130, as the smart card 130 may not include a power source. The smart card 130 can transmit data to the card reader 110 by modulating the carrier signal with the data. The card reader 110 can demodulate the signal from the smart card 130 to derive the data.

Figure 2:
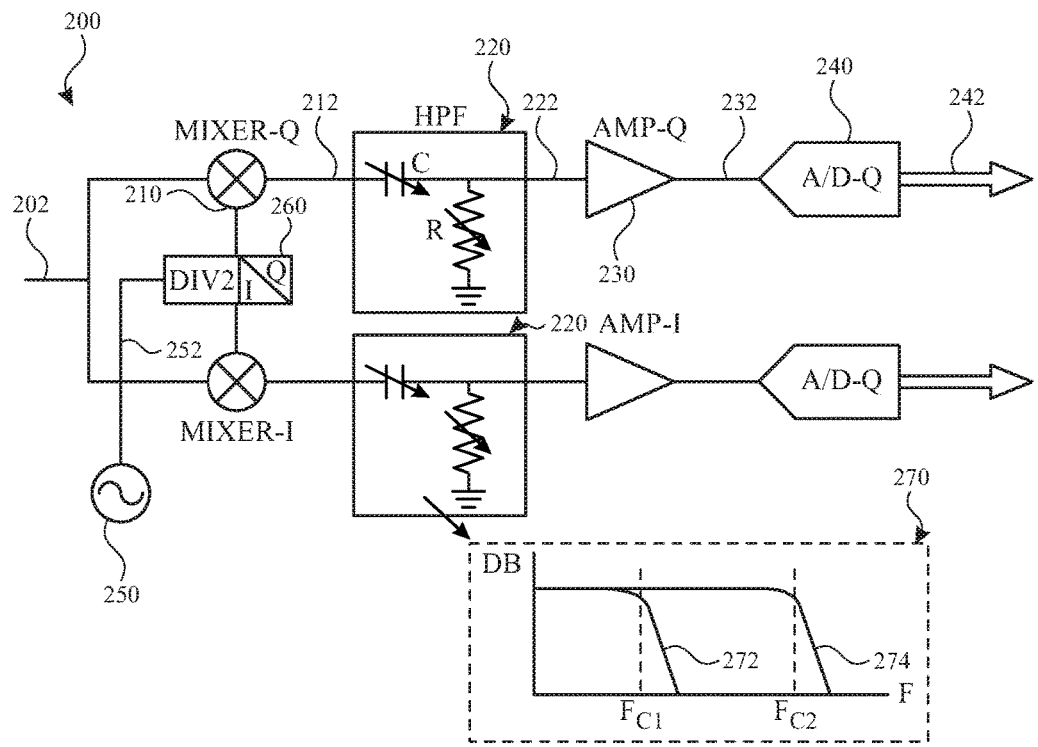
FIG. 2 is a schematic diagram illustrating an example near-field communication (NFC) receiver circuit including a high-pass filter (HPF) with adjustable cut-off frequency, in accordance with one or more aspects of the subject technology

FIG. 2 is a schematic diagram illustrating an example NFC receiver circuit 200 including a high-pass filter (HPF) 200 with adjustable cut-off frequency, in accordance with one or more aspects of the subject technology. Not all of the depicted components may be used in all implementations, however, and one or more implementations may include additional or different components than those shown in the FIG. 2. Variations in the arrangement and type of the components may be made without departing from the spirit or scope of the claims as set forth herein. Additional components, different components, or fewer components may be provided.

The NFC receiver circuit 200 is an example implementation of the smart card 130 of FIG. 1. The NFC receiver circuit 200 is an in-phase (I)-quadrature (Q) receiver that includes local oscillator (LO) generator 250, a frequency divider 260 and separate and similar I and Q receive channels. The frequency divider 260 may receive a signal 252 from the LO generator 250 and divides a frequency of the signal 252 by two to generate I and Q channel LO signals at a LO frequency ($f_{LO}$). The Q-channel LO signal has a 90° phase shift with respect to the I-channel LO signal. For example, the Q-channel LO signal may include a cos ($2\pi f_{LO}$) time function, whereas the I-channel LO signal can include a sin ($2\pi f_{LO}$)) time function. Each of the I and Q receive channels include a mixer 210, a high-pass filter (HPF) 220, an amplifier 230 and an analog-to-digital converter (ADC) 240, which are labeled only for the Q-channel for simplicity.

The mixer 210 (e.g., a Q-mixer or an I-mixer for the I receive channel) is a zero intermediate-frequency (IF) (also known as a homodyne) mixer and receives a corresponding LO signal (e.g., the Q-channel LO or the I-channel LO) and uses the LO signal to down-convert a radio frequency (RF) signal 202 received from a card reader (e.g., 110 of FIG. 1) into a down-converted signal 212. The HPF 220 is used to remove DC offset from the down-converted signal 212 to recover a baseband signal 222. The DC offset can be generated as a result of down-conversion of a strong nearby signal, including the LO signal of the NFC receiver circuit 200 itself (e.g., self-mixing), for instance, due to finite isolation between the LO and RF ports of the NFC receiver circuit 200.

The cut-off frequency (e.g., $f_{c1}$) of the HPF 220 is to be set low enough to substantially filter out the DC offset. It is understood, however, that setting the cut-off frequency too low can lead to an unacceptable settling time of the NFC receiver circuit 200, which results in a slow response of the receiver. The subject technology allows for adjusting (e.g., dynamically) the cut-off frequency of the HPF 220, as shown in the frequency response chart 270, for example, at a first cut-off frequency (e.g., $f_{c1}$ of a response curve 272) or at a second cut-off frequency (e.g., $f_{c2}$ of a response curve 274) in different time intervals, as discussed in more detail herein. In one or more implementations, alternative dynamic adjusting strategies can be adopted to suitably adjust the cut-off frequency of the HPF 220. In some embodiments, the HPF 220 includes a variable resistor R and a variable capacitor C, the value of which can be adjusted by a control circuit to achieve the desired cut-off frequency. In some implementations, the first cut-off frequency (e.g., $f_{c1}$) is a low frequency within a range of about 1-3 KHz, and the second cut-off frequency (e.g., $f_{c2}$) is a high frequency within a range of about 200-500 KHz.

The amplifier 230 is a baseband amplifier and, in some embodiments, may be implemented as a variable-gain amplifier (VGA). The amplifier 230 can amplify the amplitude of the baseband signal 222 to produce an amplified baseband signal 232 that is suitably within a specified dynamic range for conversion by the ADC 240. The ADC 240 converts the amplified baseband signal 232 to a digital baseband signal 242 that can be processed (e.g., decoded, demodulated, and the like) by a processor (e.g., a baseband processor).

Figure 3:
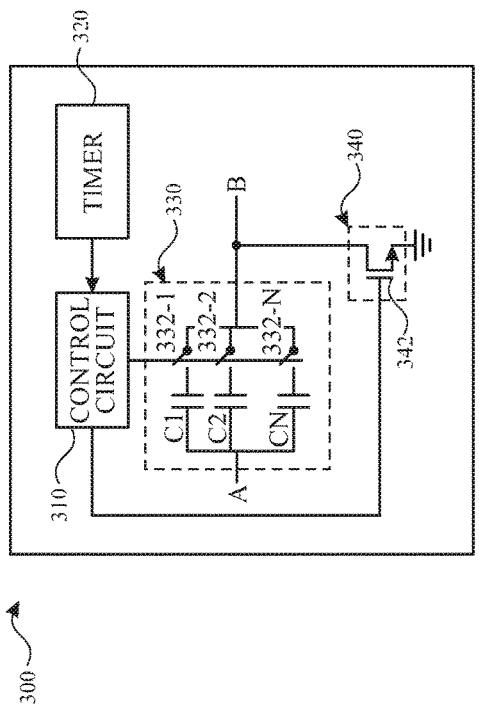
FIG. 3 is a schematic diagram illustrating an example of a control circuit for dynamically adjusting the cut-off frequency of the HPF of FIG. 2, in accordance with one or more aspects of the subject technology.

FIG. 3 is a schematic diagram illustrating an example of a control circuit 300 for dynamically adjusting the cut-off frequency of the HPF 220 of FIG. 2, in accordance with one or more aspects of the subject technology. Not all of the depicted components may be used in all implementations, however, and one or more implementations may include additional or different components than those shown in the FIG. 3. Variations in the arrangement and type of the components may be made without departing from the spirit or scope of the claims as set forth herein. Additional components, different components, or fewer components may be provided.

The control circuit 300 includes a control circuit 310, a timer 320, a switch-capacitor array 330 and a transistor 340. The control circuit 310 controls the adjustment of the capacitance of the switch-capacitor array 330 and a resistance of the transistor 340 based on timing information received from the timer 320. The timer 320 is synchronized with a clock signal of the NFC receiver circuit 200 of FIG.

2 and generates timing signals for the control circuit 310. The timing signals allow the control circuit 310 to dynamically adjust the capacitance of the switch-capacitor array 330 and the resistance of the transistor 340 to achieve the desired cut-off frequency of the HPF 220 at desired intervals (e.g., a first and a second time period) as discussed in more detail herein.

The switch-capacitor array 330 is an implementation of the capacitor C of the HPF 220, and the variable resistance of the transistor 340 (e.g., field-effect transistor (FET) such as a metal-oxide-semiconductor (MOS) FET) implements the resistor R of the HPF 220. The switch-capacitor array 330 includes a number of (e.g., N, such as 20 or more) capacitors (e.g., C1, C2 ... CN) and corresponding switches 332 (e.g., 332-1, 332-2 ... 332-N). The state of switches 332 is controlled by the control circuit 310 and in turn controls the number of parallel connected capacitors that determines a respective total capacitance of the switch-capacitor array 330. The resistance of the transistor 340 (e.g., a FET or MOSFET) may be a drain-source resistance that is adjusted by the control circuit 310 via changing a gate voltage of a gate terminal 342 of the transistor 340. In some embodiments, the control circuit 310 can control the capacitance of the switch-capacitor array 330 and/or the resistance of the transistor 340 independently or simultaneously.

Figure 4:
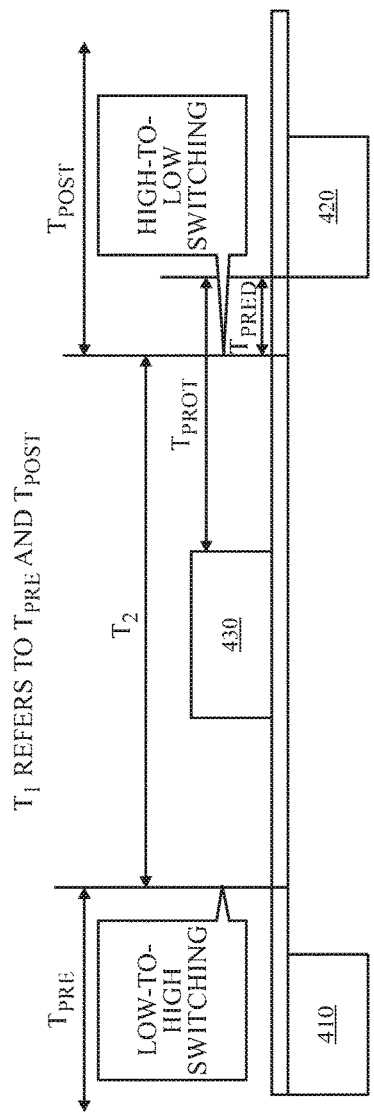
FIG. 4 is a timing diagram illustrating an example adjustment over time of the cut-off frequency of the HPF of FIG. 2, in accordance with one or more aspects of the subject technology.

FIG. 4 is a timing diagram 400 illustrating an example adjustment over time of the cut-off frequency of the HPF of FIG. 2, in accordance with one or more aspects of the subject technology. The timing diagram 400 illustrates first and second signals 410 and 420 (e.g., command pulses) transmitted by a card reader (e.g., 110 of FIG. 1) and a response pulse 430 transmitted by a smart card (e.g., 130 of FIG. 1). In some implementations, the first signal can be a request command type B (REQB) of an NFC protocol (e.g., ISO/IEC 14443) and the second signal can be a proximity integrated circuit card (PICC) selection command (ATTRIB) of the NFC protocol. The response pulse 430 can be a response to a question type B (ATQB) of the NFC protocol.

The subject technology allows setting (e.g., by the control circuit 300 of FIG. 3) the cut-off frequency of the HPF 220 of FIG. 2 to a first frequency (e.g., $f_{c1}$ of FIG. 2) during a first time period and to a second frequency (e.g., $f_{c2}$ of FIG. 2) in a second time period. The first frequency is, for example, within a range of about 1-3 KHz, and the second frequency is, for example, within a range of about 200-500 KHz. In some implementations, the first time period $T_1$ includes a pre-transmit time period $T_{pre}$ and a post-transmit time period $T_{post}$. The pre-transmit time period $T_{pre}$ is a time period prior to transmission of the response pulse 430, by the smart card 130, in response to receiving the first signal 410 from the card reader 110. The second time period $T_2$ is a time period between an end of the pre-transmit time period $T_{pre}$ and a beginning of the post-transmit time period $T_{post}$. The beginning of the post-transmit time period $T_{post}$ precedes an expected receiving time of a second signal 420 by a predetermined time window $T_{pred}$ (e.g., between about 10-15 μsec). The predetermined time window $T_{pred}$ is determined based on a protocol time ($T_{prot}$) specified by the protocol (e.g., about 132 μsec). The protocol time $T_{prot}$ specifies a time interval between the end of the response pulse 430 and the beginning of the second signal 420.

The setting of the cut-off frequency of the HPF 220 to the first frequency (e.g., the low frequency within the range of about 1-3 KHz) during a first time period $T_1$, facilitated by the subject technology, allows substantial filtering of the DC offset of the NFC receiver circuit 200 of FIG. 2. Whereas, the setting of the cut-off frequency of the HPF 220 to the second frequency (e.g., the high frequency within the range of about 200-500 KHz) during the second time period $T_2$ leads to a faster (e.g., shorter) response time of the NFC receiver circuit 200. The faster response can guarantee that no portion of the second signal 420 is missed by the NFC receiver circuit 200. If the cut-off frequency of the HPF 220 is not increased to the high frequency (e.g., within a range of about 200-500 KHz) during the second time period $T_2$, the slow response time (e.g., a few milliseconds) corresponding to the low cut-off frequency can result in the NFC receiver circuit 200 missing at least a first portion of the second signal 420.

Figure 5:
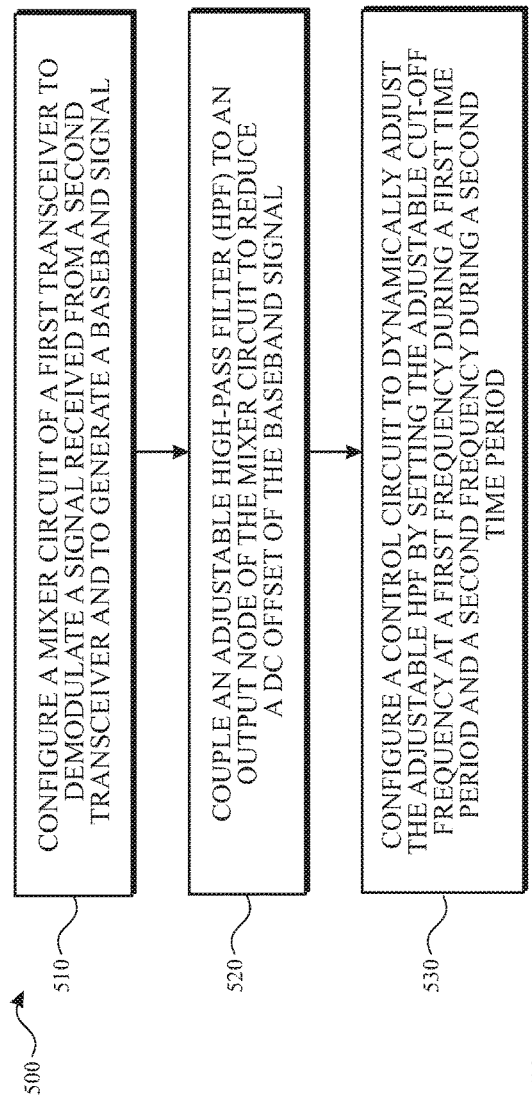
FIG. 5 is a flow diagram illustrating an example process for dynamically adjusting the cut-off frequency of the HPF of FIG. 2, in accordance with one or more aspects of the subject technology.

FIG. 5 is a flow diagram illustrating an example process 500 for dynamically adjusting the cut-off frequency of the HPF of FIG. 2, in accordance with one or more aspects of the subject technology. For explanatory purposes, the process 500 is primarily described herein with reference to the NFC receiver circuit 200 of FIG. 2. However, the process 500 is not limited to the NFC receiver circuit 200 of FIG. 2, and one or more blocks (or operations) of the process 500 may be performed by one or more other components of the NFC receiver circuit 200. Further for explanatory purposes, the blocks of the example process 500 are described herein as occurring in serial, or linearly. However, multiple blocks of the example process 500 may occur in parallel. In addition, the blocks of the example process 500 need not be performed in the order shown and/or one or more of the blocks of the example process 500 need not be performed.

The process 500 includes configuring a mixer circuit (e.g., 210 of FIG. 2) of a first transceiver (e.g., 130 of FIG. 1) to demodulate a signal (e.g., 202 of FIG. 2) received from a second transceiver (e.g., 110 of FIG. 1) to generate a baseband signal (e.g., 212 of FIG. 2) (510). An adjustable high-pass filter (HPF) (e.g., 220 of FIG. 2) can be coupled to an output node of mixer circuit to reduce a DC offset of the baseband signal (520). A control circuit (e.g., 310 of FIG. 3) can be configured to dynamically adjust the adjustable HPF by setting the adjustable cut-off frequency (e.g., see chart 270 of FIG. 2) at a first frequency (e.g., $f_{c1}$ of chart 270 of FIG. 2) during a first time period (e.g., $T_1$ of FIG. 4) and at a second frequency (e.g., $f_{c2}$ of chart 270 of FIG. 2) during a second time period (e.g., $T_2$ of FIG. 4) (530).

Figure 6:
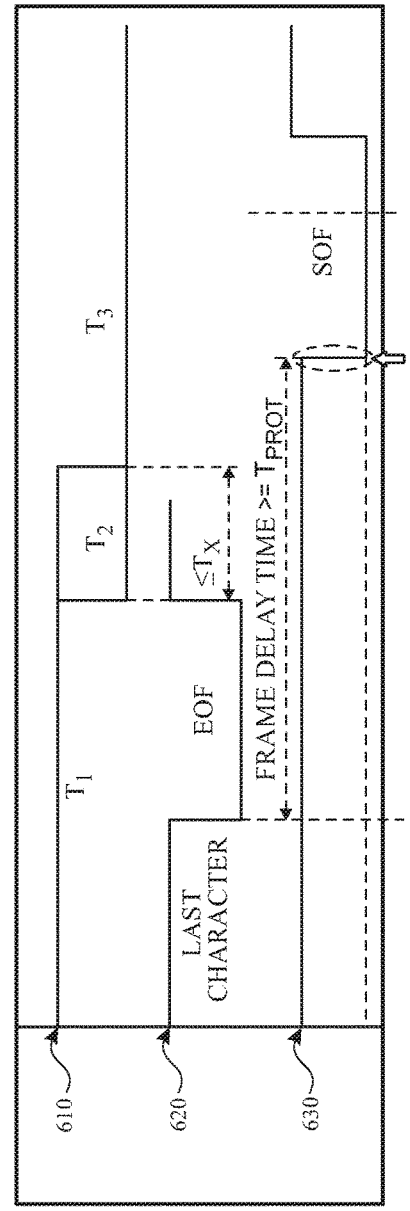
FIG. 6 is a time chart illustrating example timing diagrams corresponding to a subcarrier signal and data exchange between a card and a reader.

FIG. 6 is a time chart 600 illustrating example timing diagrams 610, 620 and 630 corresponding to a subcarrier signal and data exchange between a card and a reader. The timing diagram 610 shows that the subcarrier signal (e.g., at 848 KHz) is in an ON state during a time period $T_1$, in an ON-to-OFF transition state in a time period $T_2$ and is in an OFF state during a time period $T_3$. The timing diagram 620 pertains to data transmission by the smart card (e.g., 130 of FIG. 1) and indicates that the smart card switches the subcarrier OFF only after the end of the end-of-frame (EOF) and within a time interval Tx (e.g., within a range of 15-20 μsec) from the end of the EOF. The diagram 630 pertains to data transmission by the card reader (e.g., 110 of FIG. 1). The falling edge at $t_s$, indicating a start of the start-of-frame (SOF), is specified by a protocol (e.g., ISO 14443) to be at least $T_{prot}$ (e.g., about 132 μsec) away from the end of the last character in the timing diagram 620 (e.g., beginning of the EOF).

Figure 7:
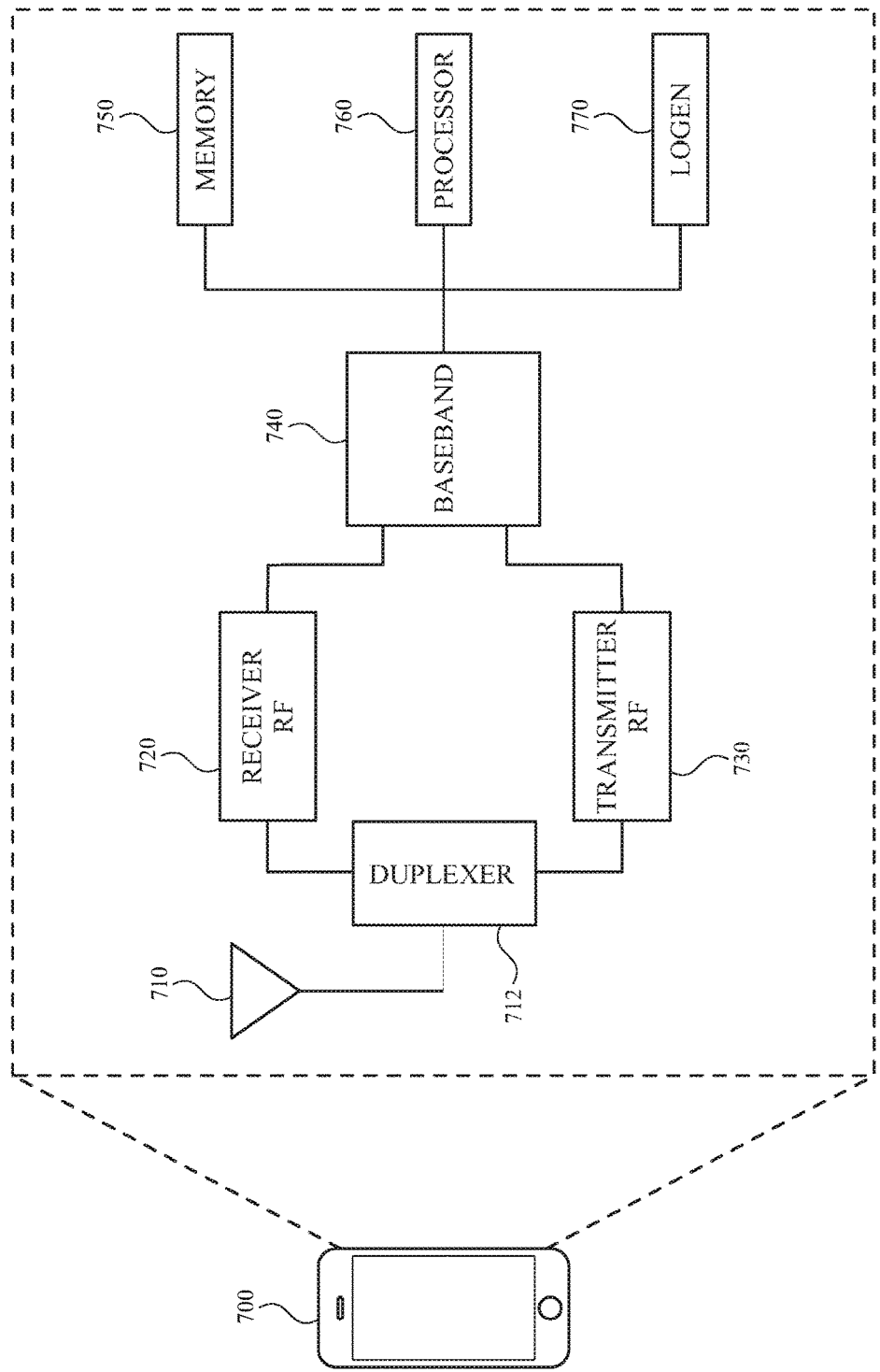
FIG. 7 is a block diagram illustrating an example wireless communication device, within which one or more aspects of the subject technology can be implemented.

FIG. 7 is a block diagram illustrating an example wireless communication device, within which one or more aspects of the subject technology can be implemented. Not all of the depicted components may be used in all implementations, however, and one or more implementations may include additional or different components than those shown in the FIG. 7. Variations in the arrangement and type of the components may be made without departing from the spirit or scope of the claims as set forth herein. Additional components, different components, or fewer components may be provided.

In some aspects, the wireless communication device 700 may represent the card reader 110 or the communication devices 120 of FIG. 1. The wireless communication device 700 may include a radio-frequency (RF) antenna 710, a receiver 720, a transmitter 730, a baseband processing module 740, a memory 750, a processor 760, and a local oscillator generator (LOGEN) 770. In various embodiments of the subject technology, one or more of the blocks represented in FIG. 7 may be integrated on one or more semiconductor substrates. For example, the blocks 720-770 may be realized in a single semiconductor chip or a single system on a semiconductor chip, or may be realized in a multi-semiconductor chip semiconductor chipset.

The receiver 720 may include suitable logic circuitry and/or code that may be operable to receive and process signals from the RF antenna 710. The receiver 720 may, for example, be operable to amplify and/or down-convert received wireless signals. In various embodiments of the subject technology, the receiver 720 may be operable to cancel noise in received signals and may be linear over a wide range of frequencies. In this manner, the receiver 720 may be suitable for receiving signals in accordance with a variety of wireless standards, Wi-Fi, WiMAX, Bluetooth, NFC and various cellular standards. In various embodiments of the subject technology, the receiver 720 may not require any SAW filters and few or no off-semiconductor chip discrete components such as large capacitors and inductors.

The transmitter 730 may include suitable logic circuitry and/or code that may be operable to process and transmit signals from the RF antenna 710. The transmitter 730 may, for example, be operable to up-convert baseband signals to RF signals and amplify RF signals. In various embodiments of the subject technology, the transmitter 730 may be operable to up-convert and amplify baseband signals processed in accordance with a variety of wireless standards. Examples of such standards may include Wi-Fi, WiMAX, Bluetooth, NFC and various cellular standards. In various embodiments of the subject technology, the transmitter 730 may be operable to provide signals for further amplification by one or more power amplifiers.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer may be operable in multiple frequency bands of various wireless standards.

The baseband processing module 740 may include suitable logic, circuitry, interfaces, and/or code that may be operable to perform processing of baseband signals. The baseband processing module 740 may, for example, analyze received signals and generate control and/or feedback signals for configuring various components of the wireless communication device 700, such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may include suitable logic, circuitry, and/or code that may enable processing data and/or controlling operations of the wireless communication device 700. In this regard, the processor 760 may be enabled to provide control signals to various other portions of the wireless communication device 700. The processor 760 may also control transfers of data between various portions of the wireless communication device 700. Additionally, the processor 760 may enable implementation of an operating system or otherwise execute code to manage operations of the wireless communication device 700.

The memory 750 may include suitable logic, circuitry, and/or code that may enable storage of various types of information such as received data, generated data, code, and/or configuration information. The memory 750 may include, for example, RAM, ROM, flash, and/or magnetic storage. In various embodiment of the subject technology, information stored in the memory 750 may be utilized for configuring the receiver 720 and/or the baseband processing module 740.

The local oscillator generator (LOGEN) 770 may include suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the wireless communication device 700 based on a wireless standard according to which it is desired to receive signals. Wireless signals may be received via the RF antenna 710 and amplified and down-converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 750, and/or information affecting and/or enabling operation of the wireless communication device 700. The baseband processing module 740 may modulate, encode, and perform other processing on audio, video, and/or control signals to be transmitted by the transmitter 730 in accordance with various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A transceiver comprising:
   a mixer circuit configured to mix a local oscillator (LO) signal with a receive (RX) signal to generate a baseband signal;
   a high-pass filter (HPF) having an adjustable cut-off frequency configured to reduce a DC offset of the baseband signal; and
   a control circuit configured to dynamically control components of the HPF to set an adjustable cut-off frequency at a first frequency during a first time period and at a second frequency during a second time period,
   wherein the first time period comprises a pre-transmit time period and a post-transmit time period, wherein the pre-transmit time period comprises a time interval prior to transmission by the transceiver in response to receiving a first signal from a transmitter of a second transceiver, and the post-transmit time period comprises a time period subsequent to the transmission by the transceiver in response to receiving the first signal from the transmitter of the second transceiver.

2. The transceiver of claim 1, wherein the first frequency comprises a low frequency within a range of about 1-3 KHz.

3. The transceiver of claim 2, wherein the second frequency comprises a high frequency within a range of about 200-500 KHz.

4. The transceiver of claim 3, wherein a settling time for transceiver responses is reduced when the adjustable cut-off frequency is adjusted from the low frequency to the high frequency.

5. The transceiver of claim 1, wherein the second time period is determined to allow a reduced settling time for a transceiver response by setting, during the second time period, the adjustable cut-off frequency of the HPF at the second frequency.

6. The transceiver of claim 1, wherein the second time period comprises a time period between an end of the pre-transmit time period and a beginning of the post-transmit time period.

7. The transceiver of claim 6, wherein the beginning of the post-transmit time period is determined to allow a reduced settling time for a transceiver response, and the beginning of the post-transmit time period precedes an expected receiving time of a second signal from the transmitter of the second transceiver by a predetermined time window of the post-transmit time period that allows settling of the transceiver response before receiving the second signal.

8. The transceiver of claim 7, wherein the predetermined time window is determined based on a protocol specification for proximity contactless cards.

9. The transceiver of claim 1, wherein the transceiver is a near-field communication (NFC) transceiver, and wherein the NFC transceiver comprises a smart card.

10. The transceiver of claim 1, wherein the components of the HPF comprise at least one of a variable resistor or a variable capacitor that is independently controllable by the control circuit.

11. The transceiver of claim 1, wherein the control circuit comprises a timer, a switch-capacitor array and a transistor.

12. The transceiver of claim 11, wherein the timer is synchronized with a clock signal of the transceiver and is configured to generate clock signals for the control circuit.

13. A communication system comprising:
    a transceiver configured to communicate with an other transceiver, the transceiver comprising:
       a demodulator configured to demodulate a signal transmitted by the other transceiver and to generate a baseband signal;
       a high-pass filter (HPF) configured to reduce a DC offset of the baseband signal; and
       a controller configured to dynamically control an adjustable cut-off frequency of the HPF by:
       setting an adjustable cut-off frequency to a first frequency during a first time period and to a second frequency during a second time period,
       wherein the first time period comprises a pre-transmit time period and a post-transmit time period, wherein the pre-transmit time period comprises a time period prior to transmission by the transceiver in response to receiving a first signal from a transmitter of the other transceiver, and the post-transmit time period comprises a time period subsequent to the transmission by the transceiver in response to receiving the first signal from the transmitter of the other transceiver.

14. The communication system of claim 13, wherein the first frequency comprises a low frequency within a range of about 1-3 KHz, and the second frequency comprises a high frequency within a range of about 200-500 KHz.

15. The communication system of claim 14, wherein the controller is configured to enable a shorter settling time for transceiver responses by setting the adjustable cut-off frequency to the high frequency.

16. The communication system of claim 13, wherein the second time period is determined to allow a reduced settling time for a transceiver response by setting, during the second time period, the adjustable cut-off frequency of the HPF at the second frequency, wherein the second time period comprises a time interval between an end of the pre-transmit time period and a beginning of the post-transmit time period, and wherein the beginning of the post-transmit time period precedes an expected receiving time of a second signal from the other transceiver by a predetermined time window of the post-transmit time period that allows settling of the transceiver response before receiving the second signal.

17. The communication system of claim 16, wherein the predetermined time window is determined based on a protocol specification for proximity contactless cards.

18. The communication system of claim 16, wherein the transceiver comprises a smart card, and the other transceiver comprises a smart card reader.

19. The communication system of claim 18, wherein the controller is configured to dynamically control the adjustable cut-off frequency of the HPF by adjusting one or more components of the HPF, wherein the components of the HPF comprise an array of switchable capacitors and a transistor.

20. A method comprising:
  configuring a mixer circuit of a first transceiver to demodulate a signal received from a second transceiver and to generate a baseband signal;
  coupling an adjustable high-pass filter (HPF) to an output node of the mixer circuit to reduce a DC offset of the baseband signal; and
  configuring a control circuit to dynamically adjust the adjustable HPF by setting an adjustable cut-off frequency at a first frequency during a first time period and at a second frequency during a second time period,
  wherein the first time period comprises a pre-transmit time period and a post-transmit time period, wherein the pre-transmit time period comprises a time interval prior to transmission by the first transceiver in response to receiving the first signal from a transmitter of the second transceiver, and the post-transmit time period comprises a time period subsequent to the transmission by the first transceiver in response to receiving the first signal from the transmitter of the second transceiver.

21. The method of claim 20, wherein the second time period comprises a time period between an end of the pre-transmit time period and a beginning of the post-transmit time period, and the beginning of the post-transmit time period precedes an expected receiving time of a second signal from the second transceiver by a predetermined time window of the post-transmit time period determined based on a protocol specification for proximity contactless cards.

* * * * *